United States Patent
Chung (10) Patent No.: US 7,515,472 B2
(45) Date of Patent: Apr. 7, 2009

(54) PAGE BUFFER CIRCUIT OF FLASH MEMORY DEVICE AND PROGRAM OPERATION METHOD THEREOF

(75) Inventor: Jun Seop Chung, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 347 days.

(21) Appl. No.: 11/479,959

(22) Filed: Jun. 30, 2006

(65) Prior Publication Data

US 2007/0183199 A1    Aug. 9, 2007

(30) Foreign Application Priority Data

Feb. 8, 2006    (KR) .................. 10-2006-0012157

(51) Int. Cl.
   *G11C 11/34* (2006.01)
   *G11C 16/06* (2006.01)
(52) U.S. Cl. .................... 365/185.21; 365/185.22; 365/189.05

(58) Field of Classification Search ........ 365/185.21 O, 365/185.22 X, 185.33, 189.05 X, 198, 185.21, 365/185.22, 189.05
See application file for complete search history.

(56) References Cited

U.S. PATENT DOCUMENTS

| 6,671,204 B2 | 12/2003 | Im |
| 7,042,770 B2 * | 5/2006 | Lee et al. ............... 365/189.05 |
| 7,099,213 B2 * | 8/2006 | Ju .............................. 365/203 |

* cited by examiner

*Primary Examiner*—VanThu Nguyen
(74) *Attorney, Agent, or Firm*—Townsend and Townsend and Crew LLP (57) ABSTRACT

A page buffer circuit includes a bit line selection circuit, a main register, a program transmission circuit, a temporary register, and a verification transmission circuit. The verification transmission circuit transmits data stored in the temporary register to the main register through a sensing node in response to a transmission control signal during a program verification operation. A memory cell that has been determined to be programmed in a previous program verification process is verified again in a next program verification process.

13 Claims, 5 Drawing Sheets

PAGE BUFFER CIRCUIT OF FLASH MEMORY DEVICE AND PROGRAM OPERATION METHOD THEREOF

BACKGROUND

The present invention relates to flash memory devices, and more particularly to a page buffer circuit and a program operation method.

In general, the read and program operations of a flash memory device are executed one page at time using a page buffer circuit. The construction and operation of the page buffer circuit in the related art will be described below.

Figure 1:
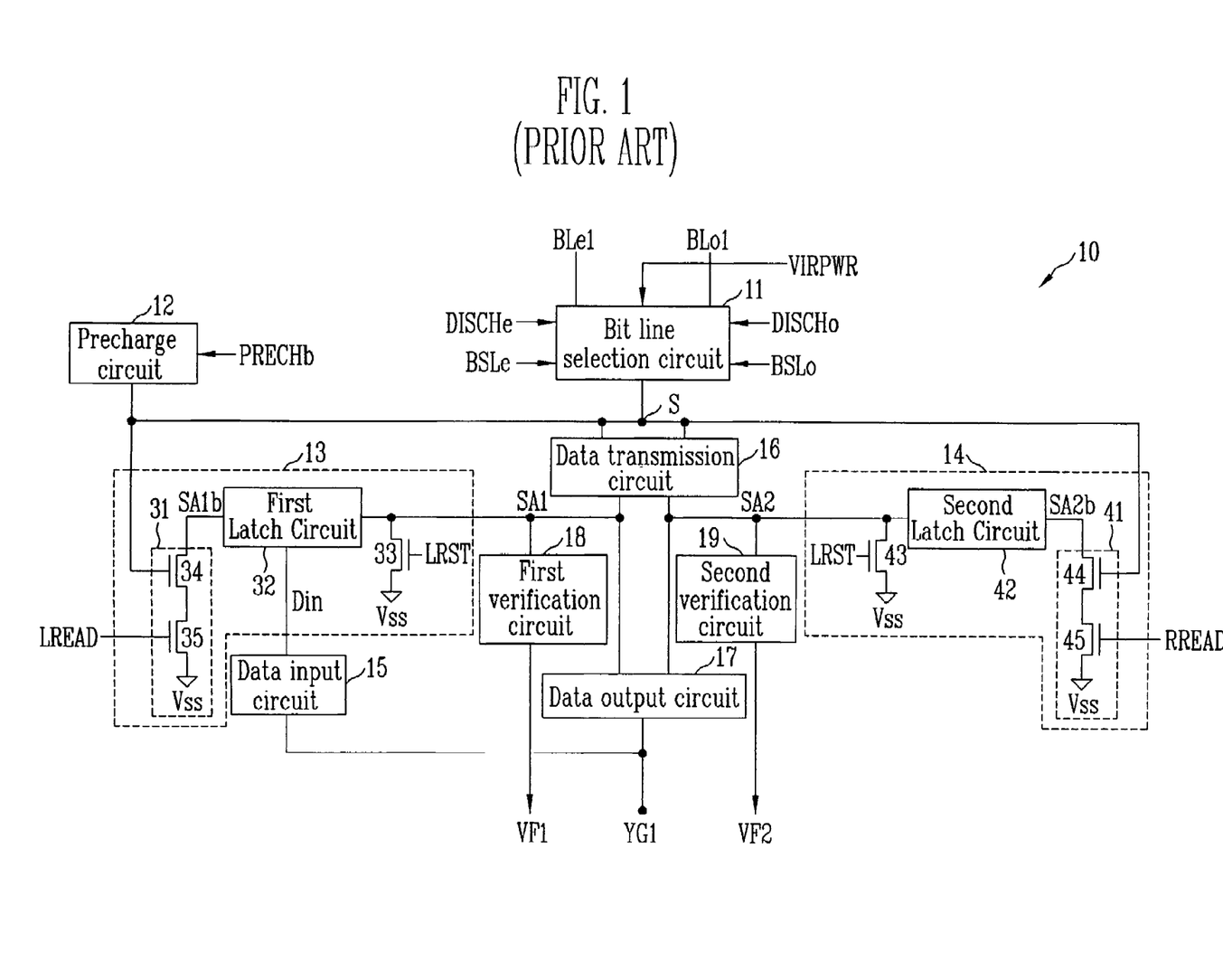
FIG. 1 is a schematic circuit diagram of a page buffer circuit of a flash memory device in the related art.

FIG. 1 is a schematic circuit diagram of a page buffer circuit of a flash memory device in the related art. A page buffer circuit 10 includes a bit line selection circuit 11, a precharge circuit 12, a first register 13, a second register 14, a data input circuit 15, a data transmission circuit 16, a data output circuit 17, a first verification circuit 18, and a second verification circuit 19. The first register 13 includes a first sensing circuit 31, a first latch circuit 32, and a first reset circuit 33. The second register 14 includes a second sensing circuit 41, a second latch circuit 42, and a second reset circuit 43.

The program operation process of the flash memory device including the page buffer circuit 10 will be described in short below. The data input circuit 15 receives input data Din from an I/O node YG1 and outputs the data to the first latch circuit 32. The first latch circuit 32 stores the input data Din and outputs the stored data as program data. The precharge circuit 12 precharges a sensing node S to a set voltage in response to a precharge control signal PRECHb. Thereafter, the data transmission circuit 16 outputs the program data to the sensing node S. The bit line selection circuit 11 outputs the program data, which is received from the sensing node S, to a memory cell (not shown) connected to a selected bit line (for example, BLe1). As a result, when a program voltage is applied to the gate of the memory cell, the program data is programmed into the memory cell.

After the memory cell has been programmed, a program verification process is used to determine whether the memory cell has been correctly programmed. In the program verification process, when the read data from the memory cell is transmitted to the sensing node S, the first register 13 senses the read data and stores the sensing data. The first verification circuit 18 generates a verification signal VF1 in response to the sensing data. Thereafter, an external control circuit (not shown) shown in FIG. 1 determines whether the memory cell has been correctly programmed according to the logic value of the verification signal VF1. If the memory cell has not been correctly programmed, the memory cell is reprogrammed. When the memory cell is reprogrammed, sensing data having the same logic value as the input data Din is stored in the first register 13 in a previous program verification process. Accordingly, the first register 13 outputs the sensing data as the program data. As a result, the memory cell is programmed.

Meanwhile, if the memory cell has been correctly programmed in the program verification process, the logic value of the sensing data stored in the first register 13 is different from that of the input data Din. In other words, when the first register 13 senses the read data from the memory cell in the program verification process, the logic value of data (i.e., input data Din) stored in the first register 13 in a previous program process is inversed. Accordingly, when a program operation is performed on the remaining memory cells (hereinafter, referred to as "second memory cell(s)") except for the memory cell (hereinafter, referred to as "first memory cell"), the first register 13 outputs the data inversed in the previous program verification process (i.e., sensing data having a logic value '1'different from a logic value '0' of the input data Din) as program-inhibit data. As a result, the programming of the first memory cell is inhibited.

Thereafter, when the program verification process is executed again, the logic value '1' of the inverted data stored in the first register 13 keeps intact without regard to a data value read from the first memory cell. Accordingly, although the program verification process is normally executed repeatedly, the same result is obtained if the program verification operation had not been performed on the first memory cell. As described above, in the program operation process on the page buffer circuit 10, the program verification operation and the program operation are no longer performed on a memory cell once it has been determined to be correctly programmed.

However, during the read operation for the program verification, there may be a case where the data (i.e., the input data Din) stored in the first register 13 is inverted even though a memory cell has not been actually programmed. This may be caused by noise, etc. within the page buffer circuit 10. Another possibility is when the threshold voltage of the programmed memory cell is substantially the same as the verification voltage (i.e., when the memory cell is not sufficiently charged).

In this case, the program verification operation and the program operation are no longer performed on a memory cell in which the program operation has not been completed. Accordingly, failure occurs in the program operation.

SUMMARY OF THE INVENTION

An embodiment of the present invention provides a page buffer circuit of a flash memory device, which can reduce the program failure by re-verifying a memory cell during the next verification process.

According to an aspect of the present invention, there is provided a page buffer circuit including a bit line selection circuit, a main register, a program transmission circuit, a temporary register, and a verification transmission circuit. The bit line selection circuit selects one of at least a pair of bit lines in response to bit line selection signals and discharge signals and connects a selected bit line to a sensing node. The main register senses the voltage of the sensing node, and stores the first sensing data according to the sensing result or stores the first or second input data, in response to a first latch control signal. The program transmission circuit outputs either the first sensing data, the first input data, or the second input data, which are received from the main register, to the sensing node in response to the program control signals. The temporary register senses the voltage of the sensing node and storing second sensing data according to the sensing result, in response to a second latch control signal. The verification transmission circuit transmits the second sensing data to the main register through the sensing node in response to a transmission control signal during a program verification operation.

According to another aspect of the present invention, there is provided a page buffer program operation method for a flash memory device, including the steps of; storing input data in a main register; transmitting the input data from a main register to a temporary register through a sensing node; transmitting the input data stored in the main register to a selected memory cell as program data so that the input data can be programmed into the selected memory cell; transmitting the input data from the temporary register to the main register through the sensing node and generating a verification sign indicating the program state of the selected memory cell based on read data read from the selected memory cell in order to verify the program verify.

In one embodiment, a page buffer circuit of a flash memory device includes a main register to store first or second input data according to an input control signal, the main register being coupled to a sensing node coupled to a bit line selection circuit to store first sensing data of the sensing node according to a first latch control signal. A program transmission circuit is provided between the main register and the sensing node, the program transmission circuit is configured to receive the first sensing data, the first input data, or the second input data at a given time and output one of the data received from the main register to the sensing node in response to a program control signal. A temporary register is coupled to the sensing node and stores second sensing data in response to a second latch control signal. A verification transmission circuit transmits the second sensing data to the main register through the sensing node in response to a transmission control signal during a program verification operation. The bit line selection circuit is configured to select one of first and second bit lines in response to a bit line selection signal and a discharge signal and connects the selected bit line to the sensing node.

In another embodiment, a program operation method for a page buffer circuit in a flash memory device includes storing input data in a main register; transmitting the input data from a main register to a temporary register through a sensing node; programming the input data stored in the main register into a memory cell as program data; transferring the input data from the temporary register to the main register through the sensing node; generating a verification signal indicating a program state of the memory cell based on data read from the memory cell; and determining whether or not the memory cell has been programmed correctly by using the verification signal.

BRIEF DESCRIPTION OF THE DRAWINGS

A more complete appreciation of the invention, and many of the attendant advantages thereof, will be readily apparent and become better understood by reference to the following detailed description when considered in conjunction with the accompanying drawings in which like reference symbols indicate the same or similar components, wherein.

DETAILED DESCRIPTION OF EMBODIMENTS

Figure 2:
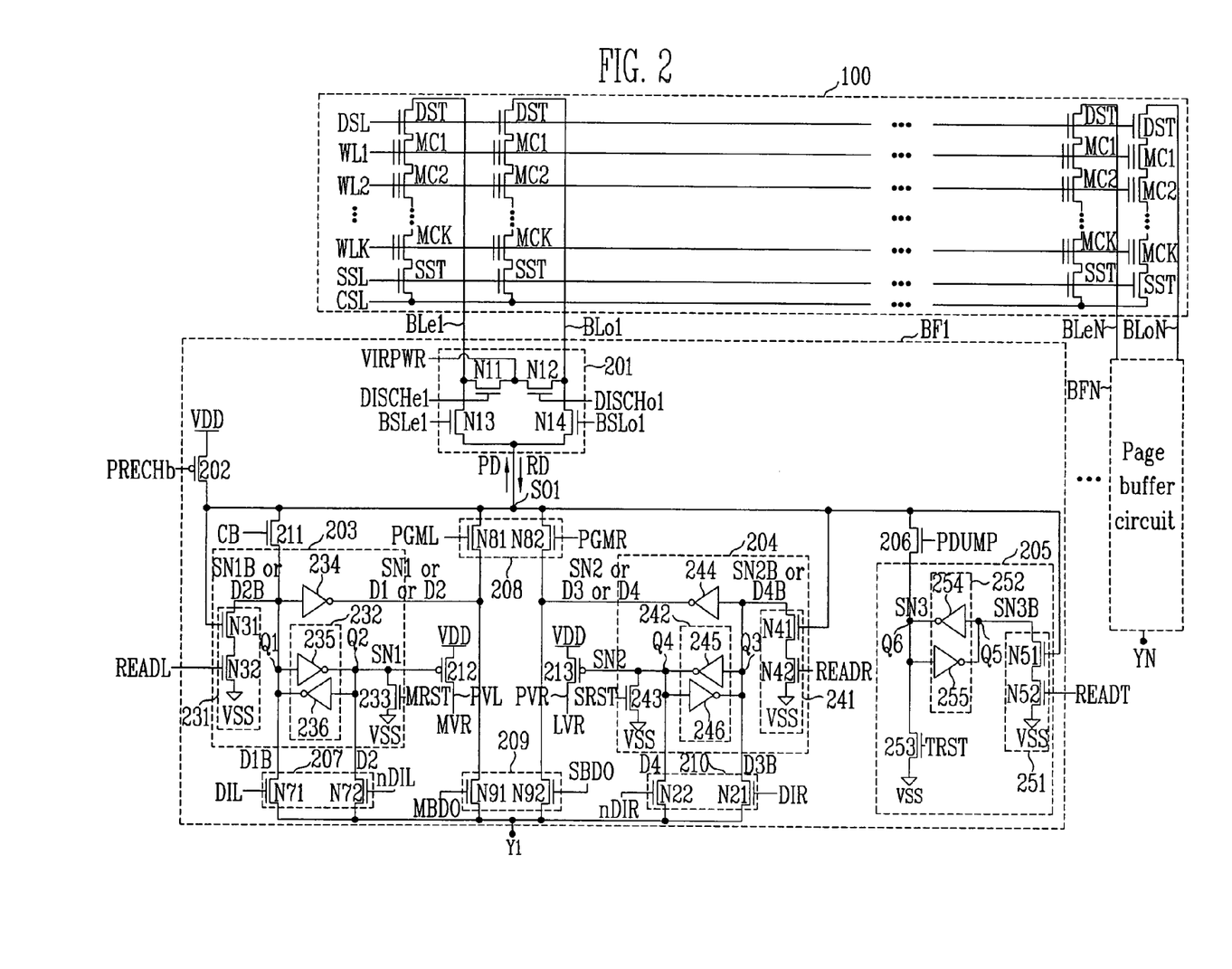
FIG. 2 is a circuit diagram of page buffer circuits and a memory cell array according to an embodiment of the present invention.

Referring to FIG. 2, a memory cell array 100 includes memory cells MC1 to MCK (K is an integer) that share bit lines BLe1 to BLeN, BLo1 to BLoN (N is an integer) and word lines WL1 to WLK. The memory cells MC1 to MCK may include single-level cells capable of storing 1-bit or multi-level cells capable of storing 2-bits. The memory cell array 100 further includes drain select transistors DST controlled by a drain select line DSL and source select transistors SST controlled by a source select line SSL. Memory cells connected to the same word line (e.g., WL1) form one page. The construction and operation of the memory cell array 100 are well known to those having ordinary skill in the art and the description thereof will be omitted.

Each of page buffers BF1 to BFN (N is an integer) is connected to a pair of bit lines. For example, the page buffer BF1 may be connected to the bit lines BLe1, BLo1. Since page buffers BF1 to BFN have substantially the same construction and operation, only page buffer BF1 will be described as an example. The page buffer BF1 includes a bit line selection circuit 201, a precharge circuit 202, a main register 203, a cache register 204, a temporary register 205, a verification transmission circuit 206, a main data input circuit 207, a program transmission circuit 208, a data output circuit 209, a cache data input circuit 210, a copyback transmission circuit 211, a main verification circuit 212, and a cache verification circuit 213.

The bit line selection circuit 201 selects one of the bit lines BLe1, BLo1 and connects it to the sensing node SO1. The selection is made in response to bit line selection signals BSLe1, BSLo1 and discharge signals DISCHe1, DISCHo1. The bit line selection circuit 201 includes NMOS transistors N11 to N14. The operations of the NMOS transistors N11 to N14 are well known to those having skill in the art and the description thereof will be omitted.

The precharge circuit 202 precharges the sensing node SO to an internal voltage VDD in response to a precharge control signal PRECHb. The precharge circuit 202 may be implemented using a PMOS transistor.

The main register 203 includes a sensing circuit 231, a latch circuit 232, a latch reset circuit 233, and an inverter 234. The sensing circuit 231 senses a voltage of the sensing node SO1 in response to a latch control signal READL and applies sensing data SN1B to a node Q1. The sensing circuit 231 includes NMOS transistors N31, N32. The latch circuit 232 includes inverters 235, 236 connected to the nodes Q1, Q2. The latch circuit 232 latches the sensing data SN1B received from the node Q1 and outputs inverted sensing data SN1 to the node Q2. Furthermore, the latch circuit 232 latches input data D1B received through the node Q1 and outputs inverted input data D1 to the node Q2. In addition, the latch circuit 232 latches input data D2 received through the node Q2 and outputs inverted input data D2B to the node Q1. The latch reset circuit 233 resets the latch circuit 232 in response to a reset control signal MRST. The latch reset circuit 233 may be implemented using an NMOS transistor. In this case, the latch reset circuit 233 connects the node Q2 to ground voltage VSS when the reset control signal MRST is enabled. As a result, the latch circuit 232 is reset. The inverter 234 receives and inverts one of the sensing data SN1B, the input data D1B, or the inverted input data D2B, which are received from the latch circuit 232 through the node Q1, and outputs inverted data SN1, D1 or D2, respectively.

The cache register 204 includes a sensing circuit 241, a latch circuit 242, a latch reset circuit 243, and an inverter 244. The sensing circuit 241 includes NMOS transistors N41, N42 and the latch circuit 242 includes inverters 244, 245. Since the cache register 204 has the same construction and operation as that of the main register 203 in the present embodiment, the description thereof will be omitted for simplicity.

The temporary register 205 includes a sensing circuit 251, a latch circuit 252, and a latch reset circuit 253. The sensing circuit 251 senses the voltage of the sensing node SO1 in response to the latch control signal READT and generates sensing data SN3B to a node Q5 according to the sensing result. The sensing circuit 251 includes NMOS transistors N51, N52. The latch circuit 252 includes inverters 254, 255 connected to the nodes Q5, Q6. The latch circuit 252 latches the sensing data SN3B received through the node Q5 and outputs the inverted sensing data SN3 to the verification transmission circuit 206 through the node Q6. The latch reset circuit 253 resets the latch circuit 252 in response to a reset control signal TRST. The latch reset circuit 253 may be implemented using an NMOS transistor. In this case, the latch reset circuit 253 connects the node Q6 to ground voltage VSS when the reset control signal TRST is enabled. As a result, the latch circuit 252 is reset.

The verification transmission circuit 206 transmits the inverted sensing data SN3 to the main register 203 through the sensing node SO1 in response to a transmission control signal PDUMP during the program verification operation. The verification transmission circuit 206 may be implemented using an NMOS transistor. In this case, the verification transmission circuit 206 outputs the inverted sensing data SN3 to the sensing node SO1 when the transmission control signal PDUMP is enabled.

The main data input circuit 207 includes NMOS transistors N71, N72. The NMOS transistor N71 is connected between a node Q1 and a data I/O node Y1 and is turned on or off in response to an input control signal DIL. When turned on, the NMOS transistor N71 outputs the input data D1B, which is received through the data I/O node Y1, to the node Q1. The NMOS transistor N72 is connected between the node Q2 and the data I/O node Y1 and is turned on or off in response to an input control signal nDIL. When turned on, the NMOS transistor N72 outputs the input data D2, which is received through the data I/O node Y1, to the node Q2.

The program transmission circuit 208 includes NMOS transistors N81, N82. The NMOS transistor N81 is connected between the sensing node SO1 and the output terminal of the inverter 234 of the main register 203, and is turned on or off in response to a program control signal PGML. When turned on, the NMOS transistor N81 outputs data (one of SN1, D1, and D2), which is received from the inverter 234, to the sensing node SO1. The NMOS transistor N82 is connected between the sensing node SO1 and the output terminal of the inverter 244 of the cache register 204, and is turned on or off in response to a program control signal PGMR. When turned on, the NMOS transistor N82 outputs data (one of SN2, D3, and D4), which is received from the inverter 244, to the sensing node SO1.

The data output circuit 209 includes NMOS transistors N91, N92. The NMOS transistor N91 is connected between the output terminal of an inverter 234 and the data I/O node Y1, and is turned on or off in response to a read control signal MBDO. When turned on, the NMOS transistor N91 outputs the inverted sensing data SN1, which is received from the inverter 234, to the data I/O node Y1 as output data.

The cache data input circuit 210 includes NMOS transistors N21, N22. The NMOS transistor N21 is connected between a node Q3 and a data I/O node Y1, and is turned on or off in response to an input control signal DIR. When turned on, the NMOS transistor N21 outputs input data D3B, which is received from the data I/O node Y1, to the node Q3. The NMOS transistor N22 is connected between a node Q4 and a data I/O node Y1, and is turned on or off in response to an input control signal nDIR. When turned on, the NMOS transistor N22 outputs input data D4, which is received from the data I/O node Y1, to the node Q4.

The copyback transmission circuit 211 outputs data (one of SN1B, D1B, and D2B), which is received from the latch circuit 232 through the node Q1, to the sensing node SO1 in response to a copyback control signal CB. The copyback transmission circuit 211 may be implemented using a NMOS transistor. In this case, the copyback transmission circuit 211 outputs the data (one of SN1B, D1B, and D2B) to the sensing node SO1 when the copyback control signal CB is enabled.

The main verification circuit 212 outputs a verification signal MVR to a verify line PVL in response to the sensing data SN1. The sensing data SN1 signal is received from the latch circuit 232 through the node Q2. The main verification circuit 212 may be implemented using a PMOS transistor 212. In this case, when the sensing data SN1 is logic '0', the main verification circuit 212 supplies the internal voltage VDD to the verify line PVL. As a result, the verification signal MVR of logic '1' is generated onto the verify line PVL. In contrast, when the sensing data SN1 is logic '1', the verify line PVL is disconnected from the internal voltage VDD. Though not shown in FIG. 2, when the main verification circuit 212 is turned off, the verify line PVL is discharged to the ground voltage VSS. Accordingly, a verification signal MVR of logic '0' is applied onto the verify line PVL.

The cache verification circuit 213 outputs a verification signal LVR to a verify line PVR in response to sensing data SN2 received from a latch circuit 242 through a node Q4. The cache verification circuit 213 may be implemented using a PMOS transistor 213. Since the cache verification circuit 213 has the same construction as that of the main verification circuit 212, the description thereof will be omitted for simplicity.

Figure 3:
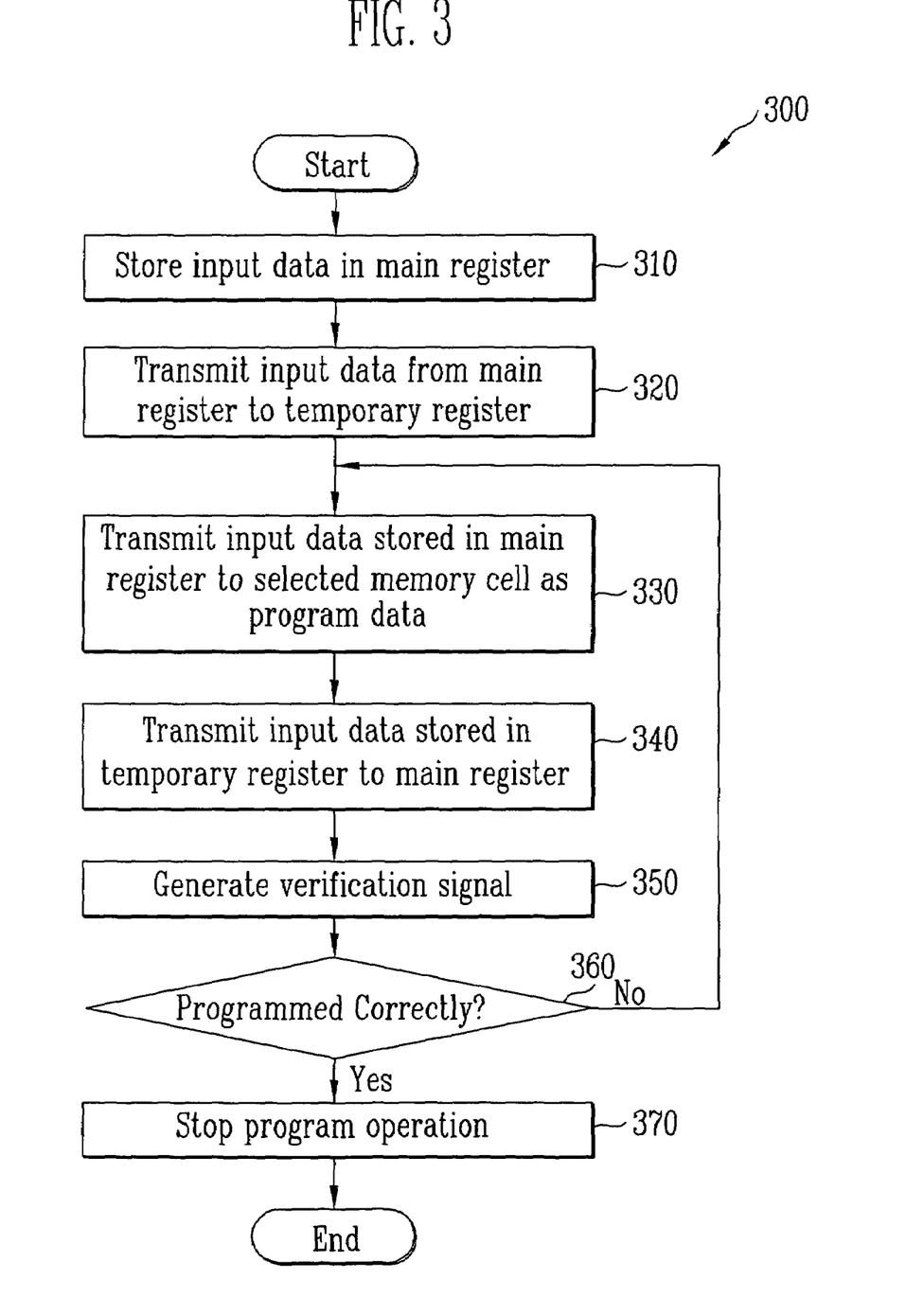
FIG. 3 is a flowchart illustrating the program operation process of the page buffer circuit shown in FIG. 2.
Figure 4:
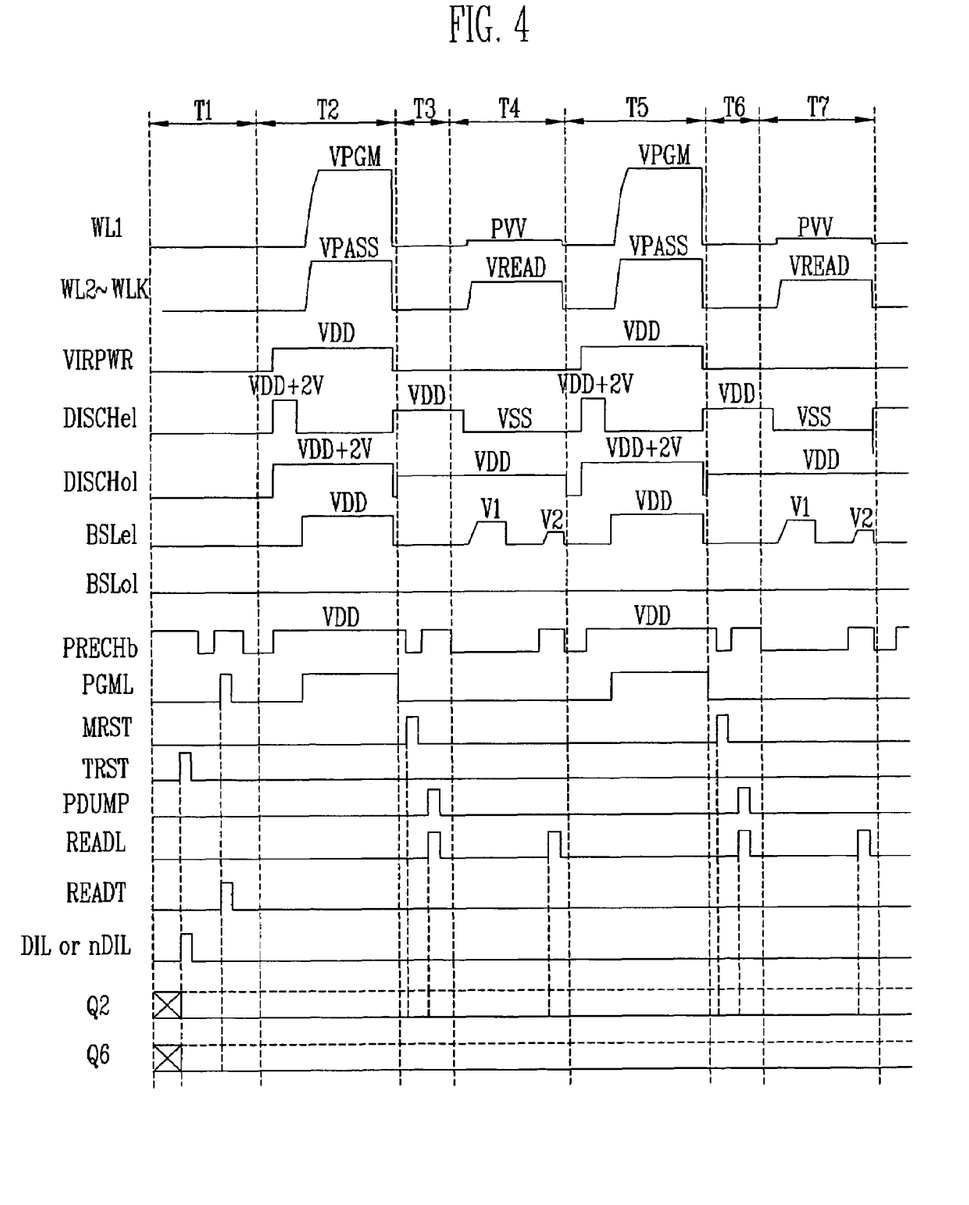
FIG. 4 is a timing diagram of the signals related to the program operation of the page buffer circuit shown in FIG. 2.

The program operation process of the page buffer circuit BF1 will be described in detail below with reference to FIGS. 3 and 4. FIG. 3 is a process 300 illustrating the program operation process of the page buffer circuit shown in FIG. 2. FIG. 4 is a timing diagram of signals related to the program operation of the page buffer circuit shown in FIG. 2.

In the present embodiment, the operation of the page buffer circuit BF1 during programming will be described as an example. The memory cell MC1, connected to the word line WL1 and the bit line BLe1, will be used in the example. Furthermore, in the present embodiment, inverted input data D1, D2B will be referred to as input data D1, D2B and inverted sensing data SN1B will be referred to as sensing data SN1, for convenience of description.

During a period T1, the input data D1B or D2 is stored in the main register 203 (step 310). As shown in FIG. 4, when the input control signal DIL or nDIL is enabled, the main data input circuit 207 outputs the input data D1B or D2 to the latch circuit 232 through the node Q1 or Q2. As a result, the latch circuit 232 latches the input data D1B or D2 and outputs the input data D2B or D1 through the node Q1 or Q2. The inverter 234 inverts the input data D1B or D2B received through the node Q1 and outputs the input data D1 or D2. Furthermore, when the reset control signal TRST is enabled, the reset control circuit 253 supplies the ground voltage VSS to the node Q6 in response to the reset control signal TRST. As a result, the latch circuit 252 of the temporary register 205 is reset.

Thereafter, the input data D1 or D2 is transmitted from the main register 203 to the temporary register 205 during the period T1 (step 320). In more detail, when the precharge control signal PRECHb is disabled, the precharge circuit 202 connects the sensing node SO1 to the internal voltage VDD. Thereafter, when the program control signal PGML is enabled, the program transmission circuit 208 outputs the input data D1 or D2, which is received from the main register 203, to the sensing node SO1. At this time, the program control signal PGMR is disabled.

If the latch control signal READT is enabled, the sensing circuit 251 of the temporary register 205 senses the voltage of the sensing node SO1 and outputs sensing data SN3B to the node Q5. The voltage of the sensing node SO1 is decided according to the logic value of the input data D1 or D2. The latch circuit 252 of the temporary register 205 latches the sensing data SN3B and outputs the sensing data SN3 to the node Q6.

For example, in the case where the input data D2 of logic '0' is applied to the sensing node SO1, the NMOS transistor N51 of the sensing circuit 251 is turned off. Accordingly, the latch circuit 252 is kept initialized. As a result, the sensing data SN3 of logic '0' is output to the node Q6. Meanwhile, in the case where the input data D1 of logic '1' is transferred to the sensing node SO1, the NMOS transistors N51 and N52 are turned on in response to the latch control signal TRST. Accordingly, the sensing data SN3B of logic '0' is generated onto the node Q5. The latch circuit 252 latches the sensing data SN3B and outputs the sensing data SN3 of logic '1' to the node Q6. Consequently, the input data D1 or D2 stored in the main register 203 is also stored in the temporary register 205.

Thereafter, during a period T2, the input data D1 or D2 stored in the main register 203 is transmitted as program data PD to the memory cell MC1 and programmed into the memory cell MC1 (step 330). In more detail, when the bit line control signal VIRPWR is pulled-up to VDD, the discharge signals DISCHe1, DISCHo1 are enabled. As a result, the bit line selection circuit 201 precharges the bit lines BLe1, BLo1 to the internal voltage VDD in response to the discharge signals DISCHe1, DISCHo1. Thereafter, the discharge signal DISCHe1 is disabled and the discharge signal DISCHo1 continues to be enabled during the period T2.

Thereafter, when the program voltage VPGM is applied to the word line WL1 and the program pass voltage VPASS is applied to the remaining word lines WL2 to WLK, the program control signal PGML and the bit line selection signal BSLe1 are enabled. At this time, the bit line selection signal BSLo1 is disabled. As a result, the bit line selection circuit 201 connects the bit line BLe1 to the sensing node SO1 and separates the bit line BLo1 from the sensing node SO1. The program transmission circuit 208 outputs the input data D1 or D2 stored in the main register 203 to the sensing node SO1 as the program data PD in response to the program control signal PGML. As a result, the program data PD (i.e., the input data D1 or D2) are transmitted to the memory cell MC1 through the bit line BLe1 and are then programmed.

During periods T3 and T4, it is determined whether the memory cell MC1 has been correctly programmed. During the period T3, the sensing data SN3 (i.e., the input data D1 or D2) stored in the temporary register 205 is transmitted to the main register 203 (340). In more detail, when the reset control signal MRST is enabled, the latch reset circuit 233 of the main register 203 connects the node Q2 to ground voltage VSS in response to the reset control signal MRST. As a result, the latch circuit 232 is reset. When the precharge control signal PRECHb is disabled, the precharge circuit 202 precharges the sensing node SO1 to the internal voltage VDD in response to the precharge control signal PRECHb. Thereafter, when the transmission control signal PDUMP is enabled, the verification transmission circuit 206 outputs the sensing data SN3 (i.e., the input data D1 or D2) to the sensing node SO in response to the transmission control signal PDUMP. The sensing data SN3 is received from the latch circuit 252.

When the latch control signal READL is enabled, the main register 203 senses the voltage of the sensing node SO1 in response to the latch control signal READL and stores the sensing data SN1B. At this time, the voltage of the sensing node SO1 is the logic value of the sensing data SN3 (i.e., the input data D1 or D2). For example, when the sensing data SN3 is logic '0', the NMOS transistor N31 of the sensing circuit 231 is turned off. As a result, the voltage of the node Q1 is kept at the voltage when the latch circuit 232 was reset. As a result, the latch circuit 232 outputs the sensing data SN1 of logic '0' to the node Q2. In contrast, when the sensing data SN3 is logic '1', the NMOS transistor N31 and N32 is turned on in response to the latch control signal READL. Accordingly, the sensing data SN1B of logic '0' is output to the node Q1. The latch circuit 232 latches the sensing data SN1B and outputs the sensing data SN1 of logic '1' to the node Q2. As a result, the sensing data SN3 (i.e., the input data D1 or D2) stored in the temporary register 205 are also stored in the main register 203 by the transmission process 340.

During the period T4, the verification signal MVR is generated (350), indicating that the memory cell MC1 has been correctly programmed. Also during the period T4, the bit line control signal VIRPWR is brought down to ground voltage (VSS) level. At this time, during a first set time, the discharge signal DISCHe1 is enabled and then disabled, and the discharge signal DISCHo1 is kept enabled. As a result, the bit line selection circuit 201 supplies the bit line control signal VIRPWR to the bit line BLe1 in response to the discharge signal DISCHe1, then supplies the bit line control signal VIRPWR to the bit line BLo1 in response to the discharge signal DISCHo1, during the first set time.

Thereafter, when the precharge control signal PRECHb is disabled, the bit line selection signal BSLe1 is brought up to a voltage (V1) level and then disabled during a second set time, and the bit line selection signal BSLo1 is disabled. The precharge circuit 202 precharges the sensing node SO1 to the internal voltage VDD. The bit line selection circuit 201 connects the bit line BLe1 to the sensing node SO1 in response to the bit line selection signal BSLe1. As a result, the bit line BLe1 is precharged to the internal voltage VDD through the sensing node SO1.

Thereafter, the verify voltage PVV is supplied to the word line WL1 and the read voltage VREAD higher than the verify voltage PVV is supplied to the word lines WL2 to WLK. At this time, the bit line selection signal BSLe1 is set to a voltage (V2) level, which is lower than the voltage V1, during a third set time. The bit line selection circuit 201 connects the bit line BLe1 to the sensing node SO1 in response to the bit line selection signal BSLe1. As a result, the read data RD from the memory cell MC1 is transferred to the sensing node SO1 through the bit line BLe1. Thereafter, while the bit line selection signal BSLe1 is set to the voltage (V2) level, the latch control signal READL is enabled. The sensing circuit 231 senses the voltage of the sensing node SO1 and outputs the sensing data SN1B to the node Q1 in response to the latch control signal READL. The voltage of the sensing node SO1 is decided according to the logic value of the read data RD.

For example, if the memory cell MC1 has been correctly programmed, the value of the read data RD becomes logic '1'. As a result, the sensing circuit 231 outputs the sensing data SN1B of logic '0' to the node Q1. The latch circuit 232 latches the sensing data SN1B and outputs the sensing data SN1 of logic '1' to the node Q2. The main verification circuit 212 stops the supply of the internal voltage VDD to the verify line PVL in response to the sensing data SN1 logic '1'. At this time, since the verify line PVL has been discharged to the ground voltage VSS, the verification signal MVR of logic '0' is generated onto the verify line PVL.

Meanwhile, if the program of the memory cell MC1 has not been completed, the logic value of the read data RD becomes logic '0'. As a result, the NMOS transistor N31 of the sensing circuit 231 is turned off and the latch circuit 232 is kept initialized. Consequently, the latch circuit 232 outputs the sensing data SN1 of logic '0' to the node Q2. The main verification circuit 212 supplies the internal voltage VDD to the verify line PVL in response to the sensing data SN1 of logic '0'. As a result, the verification signal MVR of logic '1' is generated to the verify line PVL.

It is then determined whether it has been programmed correctly according to a logic value of the verification signal MVR (step 360). If the verification signal MVR is logic '0', it means that the memory cell MC1 has been correctly programmed. Accordingly, the program operation is stopped (step 370). If the verification signal MVR is logic '1', it means that the memory cell MC1 has not been programmed correctly. Accordingly, the steps 330 to 360 are repeated. In FIG. 4, the operation of the page buffer circuit BF1 during periods T5 to T7 is the same as that of the page buffer circuit BF1 during the periods T2 to T4.

As described above, in the program operation process of the page buffer circuit BF1, whenever the program verification operation is executed, the operation of transmitting data to the main register 203 is performed. The transmitting data, i.e., input data stored in the main register 203 in order to program the memory cell MC1, is stored in the temporary register 205. Accordingly, the previous program operation of the memory cell MC1 can be re-verified during a subsequent program verification process. The program verification operations can be performed more than once on a given memory cell for a particular program operation. It is therefore possible to reduce the occurrence of program failure. Variation in the threshold voltages of the memory cells depending on the program operation process of the page buffer circuits BF1 to BFN will be described below.

Figure 5:
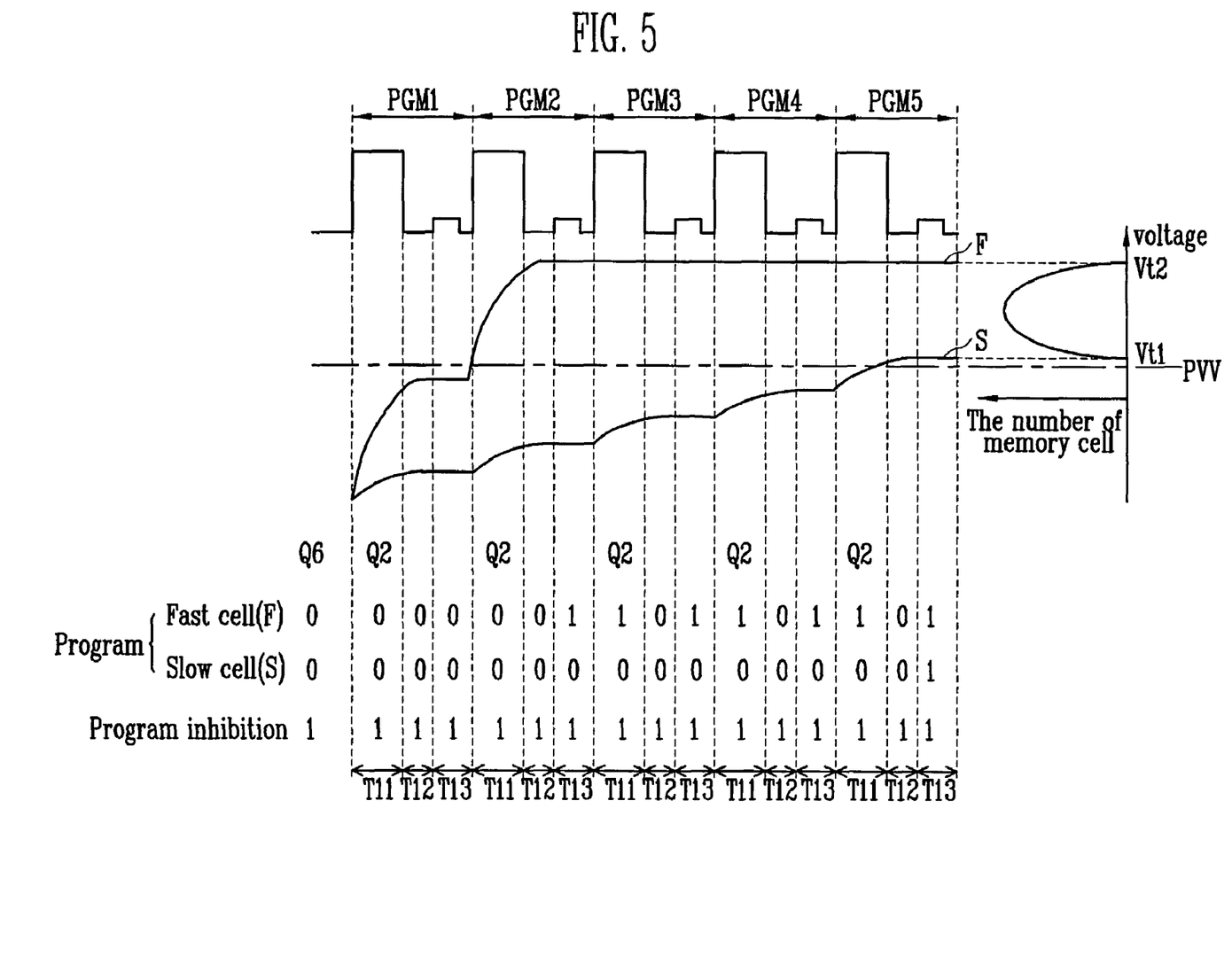
FIG. 5 is a view illustrating threshold voltage distributions of a memory cell that is programmed according to the program operation process of the page buffer circuit shown in FIG. 2.

FIG. 5 is a view illustrating threshold voltage distributions of a memory cell that is programmed according to the program operation process of the page buffer circuit shown in FIG. 2. It shows variations in the threshold voltages of memory cells in one page (i.e., memory cells connected to one word line). FIG. 5 also illustrates logic values of data (i.e., input data or sensing data), which are output from the latch circuits 232, 252 to the nodes Q2, Q6, when the program process is repeated five times.

In FIG. 5, a graph F indicates variations in threshold voltage of cells having a fast response speed and a graph S indicates variations in threshold voltage of cells having a slow response speed. Data of logic '0' are output to the nodes Q2, Q6 of page buffers to which memory cells to be programmed are connected. Data of logic '1' are output to the nodes Q2, Q6 of each page buffer to which the program of memory cells will be inhibited are connected.

As program processes PGM1 to PGM4 are consecutively executed, the threshold voltages of the memory cells are increased as indicated by the graphs F, S. Thereafter, in the last program process PGM5, the threshold voltages of the memory cells become higher than the verify voltage PVV. Furthermore, the threshold voltage of the fastest cell becomes Vt2 and the threshold voltage of the slowest cell becomes Vt1, which is lower than Vt2. Each of the program processes PGM1 to PGM5 may be divided into a program period T11, a data transmission period T12 from the temporary register to the main register, and a read period T13 for program verify. As shown in FIG. 5, in the program process of the page buffer circuit according to the present invention, the data transmission period T12 is repeated from the first program process PGM1 to the last program process PGM5.

Accordingly, although the cell has been determined to be programmed correctly (i.e., a data value of the node Q2 is inverted to logic '1') during a previous program verification operation (e.g., the read period T13 of PGM2 for the fast cell), the data value of the node Q2 can be reset to logic '0' during a next program verification operation (e.g., the data transmission period T12 of PGM3 for the fast cell). Consequently, a memory cell that has been determined to be programmed in a previous program verification operation can be verified again in a next program verification operation.

As described above, in accordance with the page buffer circuit and the program operation method thereof according to the present invention, memory cells that have been determined to be programmed in a previous program verification process can be verified again in a next program verification process, failure in the program operation can be reduced.

While the invention has been described in connection with what is presently considered to be specific embodiments, it is to be understood that the invention is not limited to the disclosed embodiments, but, on the contrary, is intended to cover various modifications and equivalent arrangements included within the spirit and scope of the appended claims.

What is claimed is:

1. A page buffer circuit of a flash memory device, comprising:
a main register to store first or second input data according to an input control signal, the main register being coupled to a sensing node coupled to a bit line selection circuit to store first sensing data of the sensing node according to a first latch control signal;
a program transmission circuit provided between the main register and the sensing node, the program transmission circuit configured to receive the first sensing data, the first input data, or the second input data at a given time and to output one of the data received from the main register to the sensing node in response to a program control signal;
a temporary register coupled to the sensing node, wherein the temporary register is configured to store second sensing data in response to a second latch control signal; and
a verification transmission circuit to transmit the second sensing data to the main register through the sensing node in response to a transmission control signal during a program verification operation,
wherein during a program operation, the program transmission circuit outputs one selected from the first sensing data, the first input data, and the second input data to the sensing node as program data in response to the program control signal,
wherein the temporary register senses a voltage of the sensing node during the program operation, the voltage corresponding to a logic value of the program data, and wherein the temporary register stores the second sensing data according to the voltage of the sensing node in response to the second latch control signal, and
wherein a logic value of the second sensing data is the same as a logic value of the program data.

2. The page buffer circuit of claim 1, wherein the bit line selection circuit is configured to select one of first and second bit lines in response to a bit line selection signal and a discharge signal, and to connect the selected bit line to the sensing node.

3. The page buffer circuit of claim 1, further comprising:
a main data input circuit to receive the first or second input data from a data I/O node and to output the first or second input data to the main register in response to the first input control signal;
a precharge circuit to precharge the sensing node to a given voltage in response to a precharge control signal;

a cache register to sense the given voltage of the sensing node, and to store third sensing data according to the sensing result or to store third or fourth input data, in response to a third latch control signal;

a cache data input circuit to output the third or fourth input data, which are received through the data I/O node, to the cache register in response to second input control signals;

a data output circuit to output the first or third sensing data, which are received from the main register or the cache register, to the data I/O node as output data in response to a read control signal;

a main verification circuit to output a first verification signal in response to the first sensing data; and a cache verification circuit to output a second verification signal in response to the third sensing data.

4. The page buffer circuit of claim 3, wherein the program transmission circuit outputs one selected from the first sensing data, the first input data, and the second input data, which are received from the main register, to the sensing node in response to the program control signal, and outputs one selected from the third sensing data, the third input data, and the fourth input data, received from the cache register, to the sensing node.

5. The page buffer circuit of claim 3, wherein the main register comprises:
a sensing circuit to sense a voltage of the sensing node and generate the first sensing data in response to the first latch control signal;
a latch circuit to latch the first sensing data received through a first node or to latch the first or second input data received from the main data input circuit through the first node or a second node;
an inverter to invert one selected from the first sensing data, the first input data, and the second input data, which is received from the latch circuit through the first node, and to output inverted data to the program transmission circuit; and
a latch reset circuit to reset the latch circuit in response to a reset control signal.

6. The page buffer circuit of claim 5, further comprising a copyback transmission circuit to output one selected from the first sensing data, the first input data, and the inverted second input data, received from the latch circuit through the first node, to the sensing node in response to a copyback control signal.

7. The page buffer circuit of claim 1, wherein the temporary register comprises:
a sensing circuit to sense a voltage of the sensing node and to generate the second sensing data according in response to the second latch control signal;
a latch circuit to latch the second sensing data and to output the second sensing data to the verification transmission circuit; and
a latch reset circuit to reset the latch circuit in response to a reset control signal.

8. A program operation method for a page buffer circuit in a flash memory device, the method comprising:
storing input data in a main register;
transmitting the input data from a main register to a temporary register through a sensing node;
programming the input data stored in the main register into a memory cell as program data;
transferring the input data from the temporary register to the main register through the sensing node;
generating a verification signal indicating a program state of the memory cell based on data read from the memory cell; and
determining whether or not the memory cell has been programmed correctly by using the verification signal.

9. The method of claim 8, further comprising repeating the transmitting, programming, transferring, and generating steps when the determining step indicates that the memory cell has not been programmed correctly.

10. The method of claim 9, wherein the transmitting step comprises:
resetting the temporary register in response to a reset control signal;
precharging the sensing node to an internal voltage in response to a precharge control signal;
outputting the input data stored in the main register to the sensing node in response to a program control signal; and
sensing a voltage of the sensing node to store sensed data in the temporary register in response to a latch control signal, the sensed data corresponding to the voltage of the sensing node.

11. The method of claim 8, wherein the programming step comprises:
precharging the sensing node to an internal voltage in response to a precharge control signal;
selecting one of first and second bit lines connected to the memory cell;
connecting the selected bit line to the sensing node in response to a bit line selection signal and a discharge signal; and
outputting the input data stored in the main register to the sensing node as the program data in response to a program control signal when a program voltage is supplied to a word line connected to the memory cell.

12. The method of claim 8, wherein the transferring step comprises:
resetting the main register in response to a reset control signal;
precharging the sensing node to an internal voltage in response to a precharge control signal;
outputting the input data stored in the temporary register to the sensing node in response to a transmission control signal; and
sensing a voltage of the sensing node to store the sensed data in the main register in response to a latch control signal, the sensed data corresponding to the voltage of the sensing node.

13. The method of claim 8, wherein the generating step comprises:
precharging the sensing node to an internal voltage in response to a precharge control signal;
selecting one of first and second bit lines connected to the memory cell;
connecting the selected bit line to the sensing node in response to a bit line selection signal and a discharge signal; and
sensing a voltage of the sensing node to store the sensing data in the main register in response to a latch control signal when a verify voltage is supplied to a word line connected to the memory cell; and
outputting the verification signal in response to the sensing data.

* * * * *